United States Patent
Agarwal et al.

(10) Patent No.: US 9,385,690 B1
(45) Date of Patent: Jul. 5, 2016

(54) INTEGRATED CIRCUIT WITH MULTIPLEXED I/O PADS

(71) Applicant: FREESCALE SEMICONDUCTOR, INC., Austin, TX (US)

(72) Inventors: Neha Agarwal, Noida (IN); Mayank Agrawal, Uttar Pradesh (IN); Chandan Gupta, Chhattisgarh (IN); Saurinkumar Patel, Noida (IN); Victor Zamanski, Kfar Saba (IL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/821,776

(22) Filed: Aug. 9, 2015

(51) Int. Cl.
*H03K 3/012* (2006.01)
*H03K 19/173* (2006.01)

(52) U.S. Cl.
CPC ............ *H03K 3/012* (2013.01); *H03K 19/1737* (2013.01)

(58) Field of Classification Search
CPC ............................ H03K 3/012; H03K 19/1737
USPC .......... 327/365, 407, 415, 564, 565, 594, 595
See application file for complete search history.

(56) References Cited

U.S. PATENT DOCUMENTS

| | | | |
|---|---|---|---|
| 6,285,211 | B1 | 9/2001 | Sample et al. |
| 7,368,946 | B1* | 5/2008 | Rahman ............... H03K 17/005 326/38 |
| 7,590,149 | B1 | 9/2009 | Bharali et al. |
| 7,650,548 | B2 | 1/2010 | Block |
| 7,855,957 | B2 | 12/2010 | Madhi, II et al. |
| 8,166,437 | B2 | 4/2012 | Chen |
| 8,290,109 | B2 | 10/2012 | Li |
| 8,327,173 | B2 | 12/2012 | Hendin et al. |
| 8,650,327 | B2 | 2/2014 | Nie et al. |
| 2007/0053475 | A1* | 3/2007 | Li ........................... H04J 3/047 375/376 |
| 2014/0075066 | A1 | 3/2014 | Menard et al. |
| 2015/0303900 | A1* | 10/2015 | Wang ............. G01R 31/318536 327/198 |

OTHER PUBLICATIONS

Anon, "Low power flop for limiting power in shift mode of an SoC", http://priorart.ip.com/IPCOM/000218101, May 21, 2012.

\* cited by examiner

*Primary Examiner* — William Hernandez
(74) *Attorney, Agent, or Firm* — Charles E. Bergere

(57) ABSTRACT

An integrated circuit (IC) includes power domains and I/O multiplexing units. The I/O multiplexing units include components that are spilt across the power domains. The I/O multiplexing units multiplex signals received from the power domains and provide signals to one or more peripheral devices connected to the IC by way of I/O pads of the IC.

18 Claims, 2 Drawing Sheets

INTEGRATED CIRCUIT WITH MULTIPLEXED I/O PADS

BACKGROUND

The present invention generally relates to integrated circuits, and, more particularly, to an integrated circuit with multiplexed input/output (I/O) pads.

Integrated circuits (ICs) integrate various digital as well as analog circuits on a single chip for performing various functions. Today's sophisticated ICs may include multiple power domains that can be switched on and off independently in order to reduce power consumption. With advancements in semiconductor technology, the number of circuits on an IC also is increasing. Increased amounts of circuitry typically requires additional external connections or input/output (I/O) pads. However, the number of input/output (I/O) pads that can be included in the IC is limited by its size/area.

One known technique to overcome the limitation on the number of I/O pads is to multiplex the I/O pads. In this regard, the IC includes multiplexers corresponding to the I/O pads. For example, an IC may include a first multiplexer corresponding to a first I/O pad, where the first multiplexer and the first I/O pad are located in a first power domain. The first multiplexer receives signals from various power domains including the first power domain to be multiplexed and provided to a peripheral device connected to the first I/O pad based on a select signal.

When power domains other than the first power domain are switched off, the first multiplexer still operates to provide a signal from the first power domain to the first I/O pad. Thus, components of the first multiplexer that receive signals from the power domains other than the first power domain are not used and hence, lead to unnecessary power consumption. Further, the first multiplexer receives signals from various power domains, leading to routing congestion and an increase in the number of isolation circuits, thereby leading to an increase in the IC area.

Therefore, it would be advantageous to have I/O multiplexing units that facilitates reduced power consumption and reduced routing congestion.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
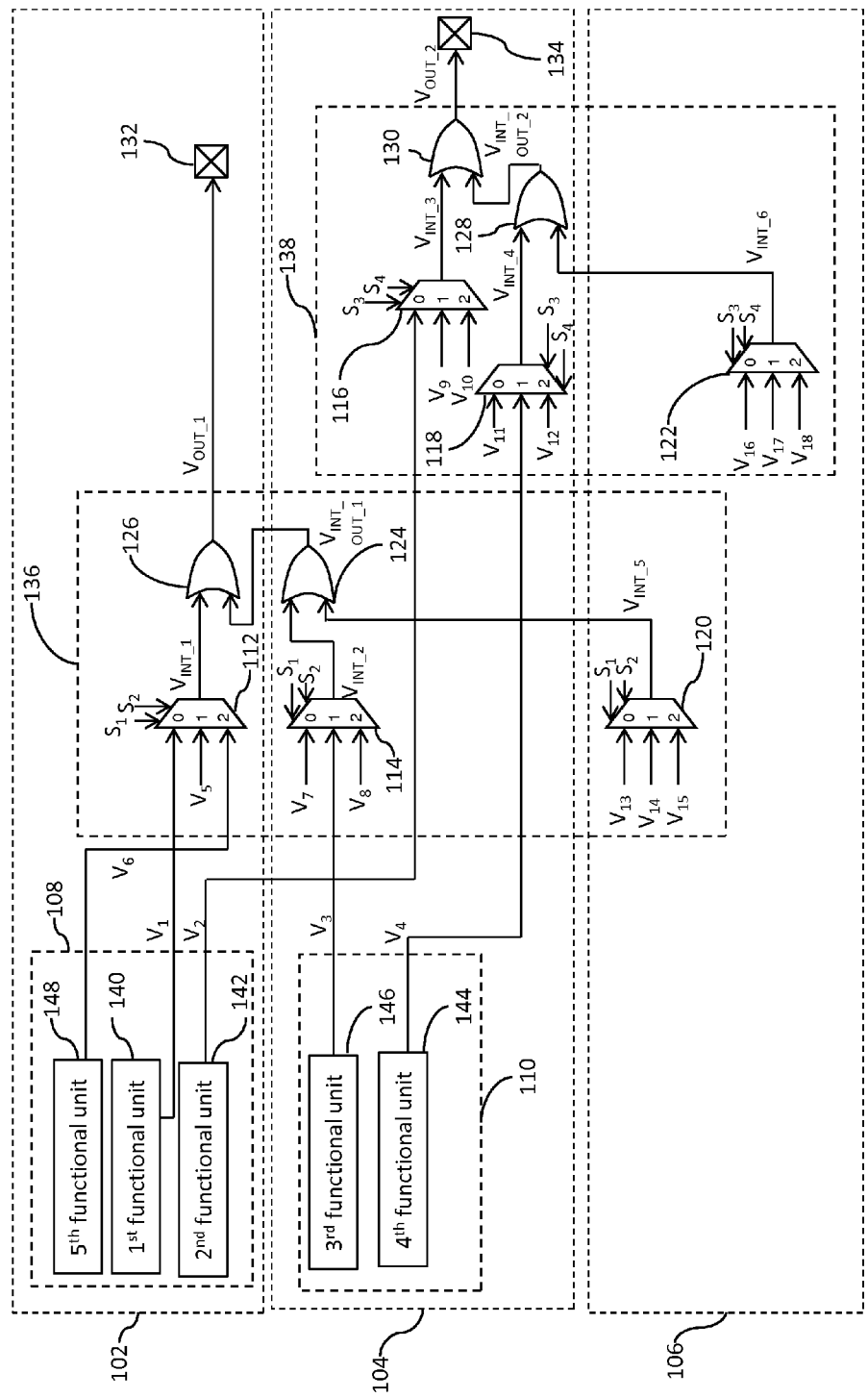
FIG. 1 is a schematic block diagram of an integrated circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In current IO mux cell design, the IO mux cell is actually a leaf cell of a pin muxing structure that always sits in the power domain where its associated Pad is located. That is, the mux and its associated pad are located in the power domain of the pad. The present invention, in order to reduce power consumption, provides a new IO mux cell design that allows the mux cell to be split across power domains. This "power aware" IO mux cell design implementation leads to lower power consumption and reduces routing congestion.

In an embodiment of the present invention, an integrated circuit (IC) is provided. The IC includes a plurality of power domains including first and second power domains. The IC includes first and second input/output (I/O) pads, first and second sets of functional units, and first and second I/O multiplexing units. The first I/O multiplexing unit includes first and second multiplexers and first and second logic gates. The second I/O multiplexing unit includes third and fourth multiplexers and third and fourth logic gates. The first set of functional units, the first multiplexer, the second logic gate, and the first I/O pad are in the first power domain. The second set of functional units, the second multiplexer, the third multiplexer, the fourth multiplexer, the first logic gate, the third logic gate, the fourth logic gate, and the second I/O pad are in the second power domain. The first set of functional units generates first and second signals. The second set of functional units generates third and fourth signals. The first multiplexer receives the first signal, a fifth signal, and a sixth signal, and outputs a first intermediate signal based on first and second select signals. The second multiplexer receives a seventh signal, the third signal, and an eighth signal, and outputs a second intermediate signal based on the first and second select signals. The first logic gate receives the second intermediate signal and a fifth intermediate signal and generates a first intermediate output signal. The second logic gate receives the first intermediate signal and the first intermediate output signal. The second logic gate generates and provides a first output signal to the first I/O pad. The third multiplexer receives the second signal, a ninth signal, and a tenth signal, and outputs a third intermediate signal based on third and fourth select signals. The fourth multiplexer receives an eleventh signal, the fourth signal, and a twelfth signal, and outputs a fourth intermediate signal based on the third and fourth select signals. The third logic gate receives the fourth intermediate signal and a sixth intermediate signal and generates a second intermediate output signal. The fourth logic gate receives the third intermediate signal and the second intermediate output signal. The fourth logic gate generates and provides a second output signal to the second I/O pad.

In another embodiment of the present invention, an integrated circuit (IC) is provided. The IC includes a plurality of power domains including first and second power domains. The IC includes first and second sets of input/output (I/O) pads, first and second functional units, and first and second I/O multiplexing units. The first I/O multiplexing unit includes first and second multiplexers and first and second logic gates. The second I/O multiplexing unit includes third and fourth multiplexers and third and fourth logic gates. The first set of I/O pads, the first multiplexer, the second logic gate, and the first functional unit are in the first power domain. The second set of I/O pads, the second multiplexer, the third multiplexer, the fourth multiplexer, the first logic gate, the third logic gate, the fourth logic gate, and the second functional unit are in the second power domain. The first set of I/O pads output first and second signals. The second set of I/O pads output third and fourth signals. The first multiplexer receives the first signal, a fifth signal, and a sixth signal, and outputs a first intermediate signal based on first and second select signals. The second multiplexer receives a seventh signal, the third signal, and an eighth signal, and outputs a second intermediate signal based on the first and second select signals. The first logic gate receives the second intermediate signal and a fifth intermediate signal and generates a first intermediate output signal. The second logic gate receives the first intermediate signal and the first intermediate output signal. The second logic gate generates and provides a first output signal to the first functional unit. The third multiplexer receives the second signal, a ninth signal, and a tenth signal, and outputs a third intermediate signal based on third and fourth select signals. The fourth multiplexer receives an eleventh signal, the fourth signal, and a twelfth signal, and outputs a fourth intermediate signal based on the third and fourth select signals. The third logic gate receives the fourth intermediate signal and a sixth intermediate signal and generates a second intermediate output signal. The fourth logic gate receives the third intermediate signal and the second intermediate output signal. The fourth logic gate generates and provides a second output signal to the second functional unit.

Various embodiments of the present invention provide an integrated circuit (IC). The IC includes power domains and input/output (I/O) multiplexing units including first and second I/O multiplexing units. The first and second I/O multiplexing units include components that are spilt across the power domains. The first I/O multiplexing unit multiplexes signals received from the power domains of the IC and provides a signal among the signals received from the power domains to one or more peripheral devices connected to the IC by way of a first I/O pad of the IC. The second I/O multiplexing unit multiplexes signals received from one or more peripheral devices by way of I/O pads of the IC and provides a signal among the signals received from the one or more peripheral devices to one or more functional units of the IC.

As the first and second I/O multiplexing units include components across the power domains of the IC, power consumption is reduced. Further, routing congestion is reduced and the number of isolation circuits required for isolating a power domain from other power domains is decreased, thereby leading to reduction in IC area.

Referring now to FIG. 1, a schematic block diagram of a first integrated circuit (IC) 100 in accordance with an embodiment of the present invention is shown. The first IC 100 includes a plurality of power domains including first through third power domains 102-106. The first IC 100 further includes first and second sets of functional units 108 and 110, first through sixth muxes 112-122, first through fourth logic gates 124-130, and first and second input/output (I/O) pads 132 and 134. In one embodiment, the first through fourth logic gates 124-130 are OR gates (or gates that in combination perform a logical OR function).

The first set of functional units 108, the first mux 112, the second logic gate 126, and the first I/O pad 132 are in the first power domain 102. The second set of functional units 110, the second mux 114, the third mux 116, the fourth mux 118, the first logic gate 124, the third logic gate 128, the fourth logic gate 130, and the second I/O pad 134 are in the second power domain 104. The fifth and sixth muxes 120 and 122 are in the third power domain 106.

The first set of functional units 108 generates first and second signals ($V_1$ and $V_2$). The second set of functional units 110 generates third and fourth signals ($V_3$ and $V_4$).

The first mux 112 has a first input terminal connected to the first set of functional units 108 for receiving the first signal, a second input terminal for receiving a fifth signal ($V_5$), and a third input terminal for receiving a sixth signal ($V_6$). The first mux 112 has a two-bit select terminal for receiving first and second select signals ($S_1$ and $S_2$) and an output terminal for outputting a first intermediate signal ($V_{INT\_1}$). The first mux 112 outputs the first signal as the first intermediate signal when the first and second select signals are at logic low state. The first mux 112 outputs the fifth signal as the first intermediate signal when the first and second select signals are at logic low state and logic high state, respectively. The first mux 112 outputs the sixth signal as the first intermediate signal when the first and second select signals are at a logic high state and logic low state, respectively.

The second mux 114 has a first input terminal for receiving a seventh signal ($V_7$), a second input terminal connected to the second set of functional units 110 for receiving the third signal, and a third input terminal for receiving an eighth signal ($V_8$). The second mux 114 has a two-bit select terminal for receiving the first and second select signals and an output terminal for outputting a second intermediate signal ($V_{INT\_2}$). The second mux 114 outputs the seventh signal as the second intermediate signal when the first and second select signals are at a logic low state. The second mux 114 outputs the third signal as the second intermediate signal when the first and second select signals are at logic low state and logic high state, respectively. The second mux 114 outputs the eighth signal as the second intermediate signal when the first and second select signals are at logic high state and logic low state, respectively.

The third mux 116 has a first input terminal connected to the first set of functional units 108 for receiving the second signal, a second input terminal for receiving a ninth signal ($V_9$), and a third input terminal for receiving a tenth signal ($V_{10}$). The third mux 116 has a two-bit select terminal for receiving third and fourth select signals ($S_3$ and $S_4$) and an output terminal for outputting a third intermediate signal ($V_{INT\_3}$). The third mux 116 outputs the second signal as the third intermediate signal when the third and fourth select signals are at logic low state. The third mux 116 outputs the ninth signal as the third intermediate signal when the third and fourth select signals are at logic low state and logic high state, respectively. The third mux 116 outputs the tenth signal as the third intermediate signal when the third and fourth select signals are at logic high state and logic low state, respectively. In one embodiment, the first IC 100 includes a first control unit (not shown) for generating the first, second, third, and fourth select signals.

The fourth mux 118 has a first input terminal for receiving an eleventh signal ($V_{11}$), a second input terminal connected to the second set of functional units 110 for receiving the fourth signal, and a third input terminal for receiving a twelfth signal ($V_{12}$). The fourth mux 118 has a two-bit select terminal for receiving the third and fourth select signals and an output terminal for outputting a fourth intermediate signal ($V_{INT\_4}$). The fourth mux 118 outputs the eleventh signal as the fourth intermediate signal when the third and fourth select signals are at logic low state. The fourth mux 118 outputs the fourth signal as the fourth intermediate signal when the third and fourth select signals are at logic low state and logic high state, respectively. The fourth mux 118 outputs the twelfth signal as the fourth intermediate signal when the third and fourth select signals are at logic high state and logic low state, respectively.

The fifth mux 120 has first, second, and third input terminals for receiving thirteenth, fourteenth, and fifteenth signals ($V_{13}$, $V_{14}$, and $V_{15}$), respectively. The fifth mux 120 has a two-bit select terminal for receiving the first and second select signals and an output terminal for outputting a fifth intermediate signal ($V_{INT\_5}$). The fifth mux 120 outputs the thirteenth signal as the fifth intermediate signal when the first and second select signals are at logic low state. The fifth mux 120 outputs the fourteenth signal as the fifth intermediate signal when the first and second select signals are at logic low state and logic high state, respectively. The fifth mux 120 outputs the fifteenth signal as the fifth intermediate signal when the first and second select signals are at logic high state and logic low state, respectively.

The sixth mux 122 has first, second, and third input terminals for receiving sixteenth, seventeenth, and eighteenth signals ($V_{16}$, $V_{17}$, and $V_{18}$), respectively. The sixth mux 122 has a two-bit select terminal for receiving the third and fourth select signals and an output terminal for outputting a sixth intermediate signal ($V_{INT\_6}$). The sixth mux 122 outputs the sixteenth signal as the sixth intermediate signal when the third and fourth select signals are at logic low state. The sixth mux 122 outputs the seventeenth signal as the sixth intermediate signal when the third and fourth select signals are at logic low state and logic high state, respectively. The sixth mux 122 outputs the eighteenth signal as the sixth intermediate signal when the third and fourth select signals are at logic high state and logic low state, respectively.

The first logic gate 124 has first and second input terminals connected to the second and fifth muxes 114 and 120 for receiving the second and fifth intermediate signals, respectively. The first logic gate 124 has an output terminal for generating a first intermediate output signal ($V_{INT\_OUT\_1}$).

The second logic gate 126 has first and second input terminals connected to the first mux 112 and the first logic gate 124 for receiving the first intermediate signal and the first intermediate output signal, respectively. The second logic gate 126 has an output terminal for generating and providing a first output signal ($V_{OUT\_1}$) to the first I/O pad 132.

The third logic gate 128 has first and second input terminals connected to the fourth and sixth muxes 118 and 122 for receiving the fourth and sixth intermediate signals, respectively. The third logic gate 128 has an output terminal for generating a second intermediate output signal ($V_{INT\_OUT\_2}$).

The fourth logic gate 130 has first and second input terminals connected to the third mux 116 and the third logic gate 128 for receiving the third intermediate signal and the second intermediate output signal, respectively. The fourth logic gate 130 has an output terminal for generating and providing a second output signal ($V_{OUT\_2}$) to the second I/O pad 134.

In an example, the first mux 112, the second mux 114, the fifth mux 120, the first logic gate 124, and the second logic gate 126 form a first I/O multiplexing unit 136. The third mux 116, the fourth mux 118, the sixth mux 122, the third logic gate 128, and the fourth logic gate 130 form a second I/O multiplexing unit 138.

In one embodiment, the fifth through eighteenth signals are at logic low state. Thus, the first I/O multiplexing unit 136 outputs the first signal to the first I/O pad 132 when the first and second select signals are at logic low state. The first I/O multiplexing unit 136 outputs the third signal to the first I/O pad 132 when the first and second select signals are at logic low state and logic high state, respectively. The first I/O multiplexing unit 136 outputs a signal at logic low state to the first I/O pad 132 when the first and second select signals are at logic high state and logic low state, respectively. The second I/O multiplexing unit 138 outputs the second signal to the second I/O pad 134 when the third and fourth select signals are at logic low state. The second I/O multiplexing unit 138 outputs the fourth signal to the second I/O pad 134 when the third and fourth select signals are at logic low state and logic high state, respectively. The second I/O multiplexing unit 138 outputs a signal at logic low state to the second I/O pad 134 when the third and fourth select signals are at logic high state and logic low state, respectively.

In another embodiment, the first set of functional units 108 generates the sixth signal. The eighth and fifteenth signals are at logic low state. Thus, the first I/O multiplexing unit 136 outputs the sixth signal to the first I/O pad 132 when the first and second select signals are at logic high and logic low state, respectively. It will be understood by those of skill in the art that the first I/O multiplexing unit 136 outputs the eighth signal to the first I/O pad 132 when the eighth signal is generated by the second set of functional units 110, the sixth signal and the fifteenth signal are at logic low state, and the first and second select signals are at logic high and logic low state, respectively. It will be further understood by those of skill in the art that the first I/O multiplexing unit 136 outputs the fifteenth signal to the first I/O pad 132 when the fifteenth signal is generated by a third set of functional units (not shown) in the third power domain 106, the sixth signal and the eighth signal are at logic low state, and the first and second select signals are at logic high and logic low state, respectively.

In yet another embodiment, the first set of functional units 108 generates the tenth signal. The twelfth and eighteenth signals are at logic low state. Thus, the second I/O multiplexing unit 138 outputs the tenth signal to the second I/O pad 134 when the third and fourth select signals are at logic high state and logic low state, respectively. It will be understood by those of skill in the art that the second I/O multiplexing unit 138 outputs the twelfth signal to the second I/O pad 134 when the twelfth signal is generated by the second set of functional units 110, the tenth and eighteenth signals are at low state, and the third and fourth select signals are at logic high state and logic low state, respectively. It will be further understood by those of skill in the art that the second I/O multiplexing unit 138 outputs the eighteenth signal to the second I/O pad 134 when the eighteenth signal is generated by the third set of functional units, the tenth and twelfth signals are at low state, and the third and fourth select signals are at logic high state and logic low state, respectively.

Thus, the first I/O multiplexing unit 136 multiplexes signals received from the power domains of the first IC 100 and provides a signal among the signals received from the power domains to a peripheral device connected to the first IC 100 by way of the first I/O pad 132. The second I/O multiplexing unit 138 multiplexes signals received from the power domains of the first IC 100 and provides a signal among the signals received from the power domains to a peripheral device connected to the first IC 100 by way of the second I/O pad 134.

In an embodiment, the first and second signals may be generated by different functional units of the first set of functional units 108. The third and fourth signals may be generated by different functional units of the second set of functional units 110. In another embodiment, the first and second signals may be generated by single functional unit of the first set of functional units 108 and may be identical. The third and fourth signals may be generated by single functional unit of the second set of functional units 110 and may be identical.

In an example, first and second functional units 140 and 142 of the first set of functional units 108 generate the first and second signals. Third and fourth functional units 144 and 146 of the second set of functional units 110 generate the third and fourth signals. A fifth functional unit 148 of the first set of functional units 108 generates the sixth signal.

It will be understood by those of skill in the art that the first IC 100 includes isolation circuits for isolating one power domain from other power domains.

In an example, the second and third power domains 104 and 106 are switched off. Thus, power supply to components of the second and third power domains 104 and 106 is switched off, i.e., power supply to the second set of functional units 110, the second mux 114, the third mux 116, the fourth mux 118, the fifth mux 120, the sixth mux 122, the first logic gate 124, the third logic gate 128, the fourth logic gate 130, and the second I/O pad 134 is switched off.

Thus, power supply to the components of the first and second I/O multiplexing units 136 and 138 that receive signals generated by the components of the second power domain 104 and the third power domain 106 is switched off, thereby reducing power consumption. Further, only one component of the first I/O multiplexing unit 136, i.e., the second logic gate 126 receives a signal (the first intermediate output signal) from the second power domain 104. This reduces routing congestion and decreases the number of isolation circuits required for isolating a power domain from other power domains, thereby reducing an area of the first IC 100.

In an example, each of the first and second I/O pads 132 and 134 includes an input buffer (not shown) and an output buffer (not shown). The input buffers receive corresponding input enable signals, thereby enabling corresponding I/O pads to function as an input pad. The output buffers receive corresponding output enable signals, thereby enabling corresponding I/O pads to function as an output pad. The input enable signals and the output enable signals may be generated by the first control unit or any other circuit of the first IC 100 and will lie under the scope of the invention.

It will be understood by those of skill in the art that when the second power domain 104 is operational, the first power domain 102 is operational and when the third power domain 106 is operational, the first and second power domains 102 and 104 are operational for effective power utilization.

Figure 2:
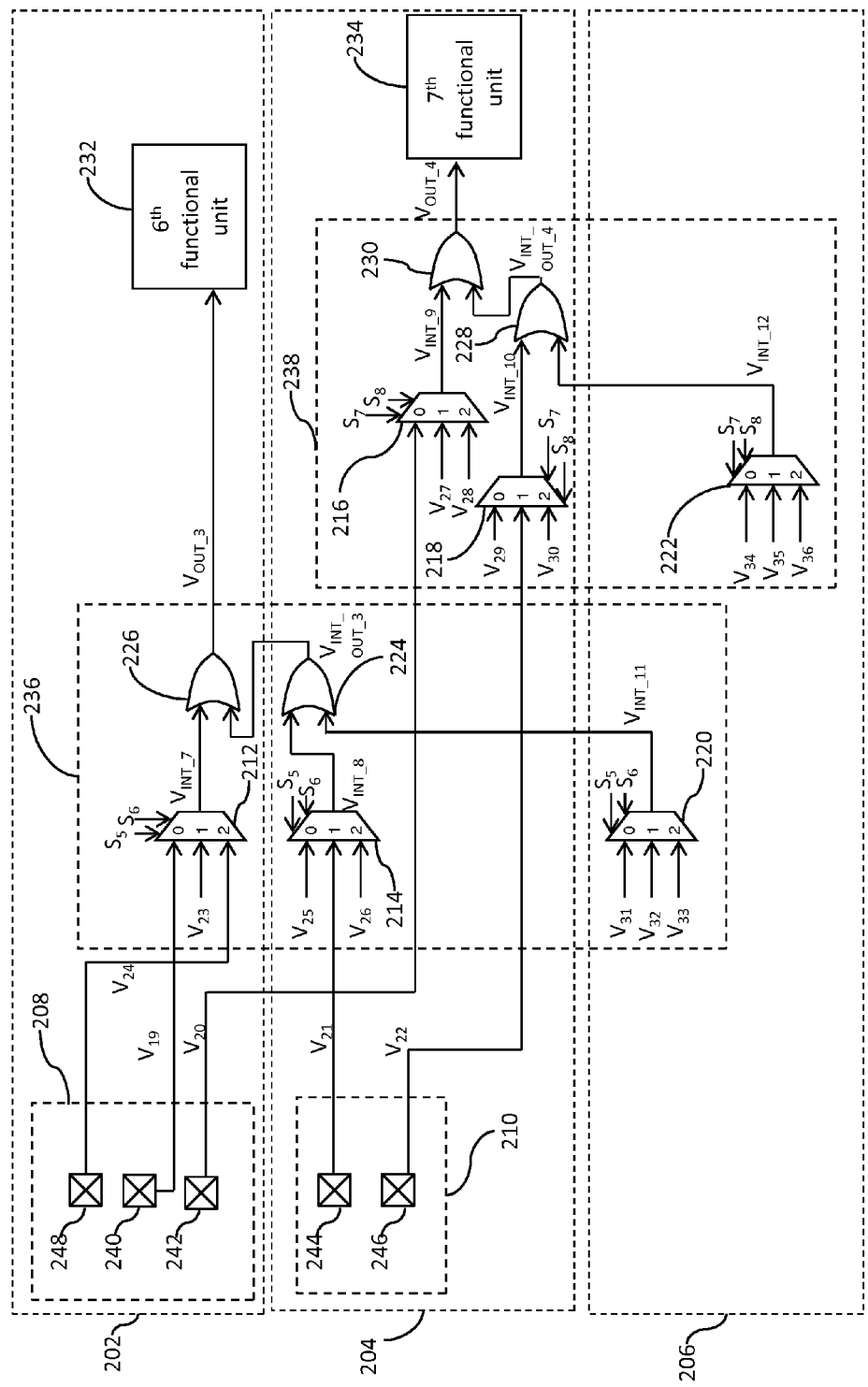
FIG. 2 is a schematic block diagram of another integrated circuit in accordance with another embodiment of the present invention.

Referring now to FIG. 2, a schematic block diagram of a second IC 200 in accordance with another embodiment of the present invention is shown. The second IC 200 includes a plurality of power domains including fourth through sixth power domains 202-206. The second IC 200 further includes first and second sets of I/O pads 208 and 210, seventh through twelfth muxes 212-222, fifth through eighth logic gates 224-230, and sixth and seventh functional units 232 and 234. In an example, the fifth through eighth logic gates 224-230 are OR gates.

The first set of I/O pads 208, the seventh mux 212, the sixth logic gate 226, and the sixth functional unit 232 are in the fourth power domain 202. The second set of I/O pads 210, the eighth mux 214, the ninth mux 216, the tenth mux 218, the fifth logic gate 224, the seventh logic gate 228, the eighth logic gate 230, and the seventh functional unit 234 are in the fifth power domain 204. The eleventh and twelfth muxes 220 and 222 are in the sixth power domain 206.

The first set of I/O pads 208 generates nineteenth and twentieth signals ($V_{19}$ and $V_{20}$). The second set of I/O pads 210 generates twenty-first and twenty-second signals ($V_{21}$ and $V_{22}$).

The seventh mux 212 has a first input terminal connected to the first set of I/O pads 208 for receiving the nineteenth signal, a second input terminal for receiving a twenty-third signal ($V_{23}$), and a third input terminal for receiving a twenty-fourth signal ($V_{24}$). The seventh mux 212 has a two-bit select terminal for receiving fifth and sixth select signals ($S_5$ and $S_6$) and an output terminal for outputting a seventh intermediate signal ($V_{INT\_7}$). The seventh mux 212 outputs the nineteenth signal as the seventh intermediate signal when the fifth and sixth select signals are at logic low state. The seventh mux 212 outputs the twenty-third signal as the seventh intermediate signal when the fifth and sixth select signals are at logic low state and logic high state, respectively. The seventh mux 212 outputs the twenty-fourth signal as the seventh intermediate signal when the fifth and sixth select signals are at logic high state and logic low state, respectively.

The eighth mux 214 has a first input terminal for receiving a twenty-fifth signal ($V_{25}$), a second input terminal connected to the second set of I/O pads 210 for receiving the twenty-first signal, and a third input terminal for receiving a twenty-sixth signal ($V_{26}$). The eighth mux 214 has a two-bit select terminal for receiving the fifth and sixth select signals and an output terminal for outputting an eighth intermediate signal ($V_{INT\_8}$). The eighth mux 214 outputs the twenty-fifth signal as the eighth intermediate signal when the fifth and sixth select signals are at logic low state. The eighth mux 214 outputs the twenty-first signal as the eighth intermediate signal when the fifth and sixth select signals are at logic low state and logic high state, respectively. The eighth mux 214 outputs the twenty-sixth signal as the eighth intermediate signal when the fifth and sixth select signals are at logic high state and logic low state, respectively.

The ninth mux 216 has a first input terminal connected to the first set of I/O pads 208 for receiving the twentieth signal, a second input terminal for receiving a twenty-seventh signal ($V_{27}$), and a third input terminal for receiving a twenty-eighth signal ($V_{28}$). The ninth mux 216 has a two-bit select terminal for receiving seventh and eighth select signals ($S_7$ and $S_8$) and an output terminal for outputting a ninth intermediate signal ($V_{INT\_9}$). The ninth mux 216 outputs the twentieth signal as the ninth intermediate signal when the seventh and eighth select signals are at logic low state. The ninth mux 216 outputs the twenty-seventh signal as the ninth intermediate signal when the seventh and eighth select signals are at logic low state and logic high state, respectively. The ninth mux 216 outputs the twenty-eighth signal as the ninth intermediate signal when the seventh and eighth select signals are at logic high state and logic low state, respectively. In one embodiment, the second IC 200 includes a second control unit (not shown) for generating the fifth, sixth, seventh, and eighth select signals.

The tenth mux 218 has a first input terminal for receiving a twenty-ninth signal ($V_{29}$), a second input terminal connected to the second set of I/O pads 210 for receiving the twenty-second signal, and a third input terminal for receiving a thirtieth signal ($V_{30}$). The tenth mux 218 has a two-bit select terminal for receiving the seventh and eighth select signals and an output terminal for outputting a tenth intermediate signal ($V_{INT\_10}$). The tenth mux 218 outputs the twenty-ninth signal as the tenth intermediate signal when the seventh and eighth select signals are at logic low state. The tenth mux 218 outputs the twenty-second signal as the tenth intermediate signal when the seventh and eighth select signals are at logic low state and logic high state, respectively. The tenth mux 218 outputs the thirtieth signal as the tenth intermediate signal when the seventh and eighth select signals are at logic high state and logic low state, respectively.

The eleventh mux 220 has first, second, and third input terminals for receiving thirty-first, thirty-second, and thirty-third signals ($V_{31}$, $V_{32}$, and $V_{33}$), respectively. The eleventh mux 220 has a two-bit select terminal for receiving the fifth and sixth select signals and an output terminal for outputting an eleventh intermediate signal ($V_{INT\_11}$). The eleventh mux 220 outputs the thirty-first signal as the eleventh intermediate signal when the fifth and sixth select signals are at logic low state. The eleventh mux 220 outputs the thirty-second signal as the eleventh intermediate signal when the fifth and sixth select signals are at logic low state and logic high state, respectively. The eleventh mux 220 outputs the thirty-third signal as the eleventh intermediate signal when the fifth and sixth select signals are at logic high state and logic low state, respectively.

The twelfth mux 222 has first, second, and third input terminals for receiving thirty-fourth, thirty-fifth, and thirty-sixth signals ($V_{34}$, $V_{35}$, and $V_{36}$), respectively. The twelfth mux 222 has a two-bit select terminal for receiving the seventh and eighth select signals and an output terminal for outputting a twelfth intermediate signal ($V_{INT\_12}$). The twelfth mux 222 outputs the thirty-fourth signal as the twelfth intermediate signal when the seventh and eighth select signals are at logic low state. The twelfth mux 222 outputs the thirty-fifth signal as the twelfth intermediate signal when the seventh and eighth select signals are at logic low state and logic high state, respectively. The twelfth mux 222 outputs the thirty-sixth signal as the twelfth intermediate signal when the seventh and eighth select signals are at logic high state and logic low state, respectively.

The fifth logic gate 224 has first and second input terminals connected to the eighth and eleventh muxes 214 and 220 for receiving the eighth and eleventh intermediate signals, respectively. The fifth logic gate 224 has an output terminal for generating a third intermediate output signal ($V_{INT\_OUT\_3}$).

The sixth logic gate 226 has first and second input terminals connected to the seventh mux 212 and the fifth logic gate 224 for receiving the seventh intermediate signal and the third intermediate output signal, respectively. The sixth logic gate 226 has an output terminal for generating and providing a third output signal ($V_{OUT\_3}$) to the sixth functional unit 232.

The seventh logic gate 228 has first and second input terminals connected to the tenth and twelfth muxes 218 and 222 for receiving the tenth and twelfth intermediate signals, respectively. The seventh logic gate 228 has an output terminal for generating a fourth intermediate output signal ($V_{INT\_OUT\_4}$).

The eighth logic gate 230 has first and second input terminals connected to the ninth mux 216 and the seventh logic gate 228 for receiving the ninth intermediate signal and the fourth intermediate output signal, respectively. The eighth logic gate 230 has an output terminal for generating and providing a fourth output signal ($V_{OUT\_4}$) to the seventh functional unit 234.

In one embodiment, the seventh mux 212, the eighth mux 214, the eleventh mux 220, the fifth logic gate 224, and the sixth logic gate 226 form a third I/O multiplexing unit 236. The ninth mux 216, the tenth mux 218, the twelfth mux 222, the seventh logic gate 228, and the eighth logic gate 230 form a fourth I/O multiplexing unit 238.

In an example, the twenty-third through thirty-sixth signals are at logic low state. Thus, the third I/O multiplexing unit 236 outputs the nineteenth signal to the sixth functional unit 232 when the fifth and sixth select signals are at logic low state. The third I/O multiplexing unit 236 outputs the twenty-first signal to the sixth functional unit 232 when the fifth and sixth select signals are at logic low state and logic high state, respectively. The third I/O multiplexing unit 236 outputs a signal at logic low state to the sixth functional unit 232 when the fifth and sixth select signals are at logic high state and logic low state, respectively. The fourth I/O multiplexing unit 238 outputs the twentieth signal to the seventh functional unit 234 when the seventh and eighth select signals are at logic low state. The fourth I/O multiplexing unit 238 outputs the twenty-second signal to the seventh functional unit 234 when the seventh and eighth select signals are at logic low state and logic high state, respectively. The fourth I/O multiplexing unit 238 outputs a signal at logic low state to the seventh functional unit 234 when the seventh and eighth select signals are at logic high state and logic low state, respectively.

In another example, the first set of I/O pads 208 generates the twenty-fourth signal. The twenty-sixth and thirty-third signals are at logic low state. Thus, the third I/O multiplexing unit 236 outputs the twenty-fourth signal to the sixth functional unit 232 when the fifth and sixth select signals are at logic high and logic low state, respectively. It will be understood by those of skill in the art that the third I/O multiplexing unit 236 outputs the twenty-sixth signal to the sixth functional unit 232 when the twenty-sixth signal is generated by the second set of I/O pads 210, the twenty-fourth signal and the thirty-third signal are at logic low state, and the fifth and sixth select signals are at logic high and logic low state, respectively. It will be further understood by those of skill in the art that the third I/O multiplexing unit 236 outputs the thirty-third signal to the sixth functional unit 232 when the thirty-third signal is generated by a third set of I/O pads (not shown) in the sixth power domain 206, the twenty-fourth signal and the twenty-sixth signal are at logic low state, and the fifth and sixth select signals are at logic high and logic low state, respectively.

In yet another example, the first set of I/O pads 208 generates the twenty-eighth signal. The thirtieth and thirty-sixth signals are at logic low state. Thus, the fourth I/O multiplexing unit 238 outputs the twenty-eighth signal to the seventh functional unit 234 when the seventh and eighth select signals are at logic high state and logic low state, respectively. It will be understood by those of skill in the art that the fourth I/O multiplexing unit 238 outputs the thirtieth signal to the seventh functional unit 234 when the thirtieth signal is generated by the second set of I/O pads 210, the twenty-eighth and thirty-sixth signals are at low state, and the seventh and eighth select signals are at logic high state and logic low state, respectively. It will be further understood by those of skill in the art that the fourth I/O multiplexing unit 238 outputs the thirty-sixth signal to the seventh functional unit 234 when the thirty-sixth signal is generated by the third set of I/O pads, the twenty-eighth and thirtieth signals are at low state, and the seventh and eighth select signals are at logic high state and logic low state, respectively.

Thus, the third I/O multiplexing unit 236 multiplexes signals received from one or more peripheral devices by way of the first and second sets of I/O pads 208 and 210 and provides a signal among the signals received from the one or more peripheral devices to the sixth functional unit 232. The fourth I/O multiplexing unit 238 multiplexes signals received from the one or more peripheral devices by way of the first and second sets of I/O pads 208 and 210 and provides a signal among the signals received from the one or more peripheral devices to the seventh functional unit 234.

In one embodiment, the nineteenth and twentieth signals may be generated by different I/O pads of the first set of I/O pads 208. The twenty-first and twenty-second signals may be generated by different I/O pads of the second set of I/O pads 210. In another embodiment, the nineteenth and twentieth signals may be generated by single I/O pad of the first set of I/O pads 208 and may be identical. The twenty-first and twenty-second signals may be generated by single I/O pad of the second set of I/O pads 210 and may be identical.

In one embodiment, third and fourth I/O pads 240 and 242 of the first set of I/O pads 208 generate the nineteenth and twentieth signals. Fifth and sixth I/O pads 244 and 246 of the second set of I/O pads 210 generate the twenty-first and twenty-second signals. A seventh I/O pad 248 of the first set of I/O pads 208 generates the twenty-fourth signal.

It will be understood by those of skill in the art that the second IC 200 includes isolation circuits for isolating one power domain from other power domains.

In one embodiment, the fifth and sixth power domains 204 and 206 are switched off. Thus, power supply to components of the fifth and sixth power domains 204 and 206 is switched off, i.e., power supply to the second set of I/O pads 210, the eighth mux 214, the ninth mux 216, the tenth mux 218, the eleventh mux 220, the twelfth mux 222, the fifth logic gate 224, the seventh logic gate 228, the eighth logic gate 230, and the seventh functional unit 234 is switched off.

Thus, power supply to the components of the third and fourth I/O multiplexing units 236 and 238 that receive signals generated by the components of the fifth power domain 204 and the sixth power domain 206 is switched off, thereby reducing power consumption. Further, only one component of the third I/O multiplexing unit 236, i.e., the sixth logic gate 226 receives a signal (the third intermediate output signal) from the fifth power domain 204. This reduces routing congestion and decreases the number of isolation circuits required for isolating a power domain from other power domains, thereby reducing an area of the second IC 200.

In one embodiment, each of the third through seventh I/O pads 240-248 includes an input buffer (not shown) and an output buffer (not shown). The input buffers receive corresponding input enable signals, thereby enabling corresponding I/O pads to function as an input pad. The output buffers receive corresponding output enable signals, thereby enabling corresponding I/O pads to function as an output pad. The input and output enable signals may be generated by the second control unit or any other circuit of the second IC 200.

It will be understood by those of skill in the art that when the fifth power domain 204 is operational, the fourth power domain 202 is operational and when the sixth power domain 206 is operational, the fourth and fifth power domains 202 and 204 are operational for effective power utilization.

It will be understood by those of skill in the art that the present invention may be used in an IC for multiplexing signals received from various power domains of the IC and providing a signal among the signals received from the power domains to one or more peripheral devices connected to the IC by way of I/O pads of the IC. The present invention may be used for multiplexing signals received from the one or more peripheral devices by way of the I/O pads of the IC and providing a signal among the signals received from the one or more peripheral devices to one or more functional units of the IC. Further, the present invention can be extended to an IC including any number of power domains.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit having a plurality of power domains including first and second power domains, the integrated circuit comprising:
   first and second input/output (I/O) pads in the first and second power domains, respectively;
   a first set of functional units located in the first power domain that generate first and second signals;
   a second set of functional units located in the second power domain that generate third and fourth signals;
   a first I/O multiplexing unit, comprising:
      a first multiplexer, in the first power domain, having a first input terminal connected to the first set of functional units for receiving the first signal, a second input terminal for receiving a fifth signal, a third input terminal for receiving a sixth signal, a two-bit select terminal for receiving first and second select signals, and an output terminal for outputting a first intermediate signal;
      a second multiplexer, in the second power domain, having a first input terminal for receiving a seventh signal, a second input terminal connected to the second set of functional units for receiving the third signal, a third input terminal for receiving an eighth signal, a two-bit select terminal for receiving the first and second select signals, and an output terminal for outputting a second intermediate signal;
      a first logic gate, in the second power domain, having a first input terminal connected to the output terminal of the second multiplexer for receiving the second intermediate signal, a second input terminal for receiving a fifth intermediate signal, and an output terminal for generating a first intermediate output signal; and
      a second logic gate, in the first power domain, having first and second input terminals connected to the output terminals of the first multiplexer and the first logic gate for receiving the first intermediate signal and the first intermediate output signal, respectively, and an output terminal for generating and providing a first output signal to the first I/O pad; and
   a second I/O multiplexing unit, comprising:
      a third multiplexer, in the second power domain, having a first input terminal connected to the first set of functional units for receiving the second signal, a second input terminal for receiving a ninth signal, a third input terminal for receiving a tenth signal, a two-bit select terminal for receiving third and fourth select signals, and an output terminal for outputting a third intermediate signal;
      a fourth multiplexer, in the second power domain, having a first input terminal for receiving an eleventh signal, a second input terminal connected to the second set of functional units for receiving the fourth signal, a third input terminal for receiving a twelfth signal, a two-bit select terminal for receiving the third and fourth select signals, and an output terminal for outputting a fourth intermediate signal;
      a third logic gate, in the second power domain, having a first input terminal connected to the output terminal of the fourth multiplexer for receiving the fourth intermediate signal, a second input terminal for receiving a sixth intermediate signal, and an output terminal for generating a second intermediate output signal; and a fourth logic gate, in the second power domain, having first and second input terminals connected to the output terminals of the third multiplexer and the third logic gate for receiving the third intermediate signal and the second intermediate output signal, respectively, and an output terminal for generating and providing a second output signal to the second I/O pad.

2. The integrated circuit of claim 1, wherein the first set of functional units generates the sixth signal.

3. The integrated circuit of claim 1, wherein the first I/O multiplexing unit further comprises a fifth multiplexer located in a third power domain, the fifth multiplexer having first, second, and third input terminals for receiving thirteenth, fourteenth, and fifteenth signals, respectively, a two-bit select terminal for receiving the first and second select signals, and an output terminal for outputting the fifth intermediate signal.

4. The integrated circuit of claim 3, wherein the second I/O multiplexing unit further comprises a sixth multiplexer located in the third power domain, the sixth multiplexer having first, second, and third input terminals for receiving sixteenth, seventeenth, and eighteenth signals, respectively, a two-bit select terminal for receiving the third and fourth select signals, and an output terminal for outputting the sixth intermediate signal.

5. The integrated circuit of claim 4, wherein the fifth through eighteenth signals are at a logic low state.

6. The integrated circuit of claim 1, wherein the first through fourth logic gates are OR gates.

7. The integrated circuit of claim 1, wherein the first power domain is operational when the second power domain is operational.

8. The integrated circuit of claim 1, wherein a functional unit of the first set of functional units generates the first and second signals, and a functional unit of the second set of functional units generates the third and fourth signals.

9. The integrated circuit of claim 1, wherein first and second functional units of the first set of functional units generate the first and second signals, respectively, and third and fourth functional units of the second set of functional units generate the third and fourth signals, respectively.

10. An integrated circuit having a plurality of power domains including first and second power domains, the integrated circuit comprising:
a first set of input/output (I/O) pads, in the first power domain, for outputting first and second signals;
a second set of I/O pads, in the second power domain, for outputting third and fourth signals;
first and second functional units in the first and second power domains, respectively; a first I/O multiplexing unit, comprising:
a first multiplexer, in the first power domain, having a first input terminal connected to the first set of I/O pads for receiving the first signal, a second input terminal for receiving a fifth signal, a third input terminal for receiving a sixth signal, a two-bit select terminal for receiving first and second select signals, and an output terminal for outputting a first intermediate signal;
a second multiplexer, in the second power domain, having a first input terminal for receiving a seventh signal, a second input terminal connected to the second set of I/O pads for receiving the third signal, a third input terminal for receiving an eighth signal, a two-bit select terminal for receiving the first and second select signals, and an output terminal for outputting a second intermediate signal;
a first logic gate, in the second power domain, having a first input terminal connected to the output terminal of the second multiplexer for receiving the second intermediate signal, a second input terminal for receiving a fifth intermediate signal, and an output terminal for generating a first intermediate output signal; and
a second logic gate, in the first power domain, having first and second input terminals connected to the output terminals of the first multiplexer and the first logic gate for receiving the first intermediate signal and the first intermediate output signal, respectively, and an output terminal for generating and providing a first output signal to the first functional unit; and
a second I/O multiplexing unit, comprising:
a third multiplexer, in the second power domain, having a first input terminal connected to the first set of I/O pads for receiving the second signal, a second input terminal for receiving a ninth signal, a third input terminal for receiving a tenth signal, a two-bit select terminal for receiving third and fourth select signals, and an output terminal for outputting a third intermediate signal;
a fourth multiplexer, in the second power domain, having a first input terminal for receiving an eleventh signal, a second input terminal connected to the second set of I/O pads for receiving the fourth signal, a third input terminal for receiving a twelfth signal, a two-bit select terminal for receiving the third and fourth select signals, and an output terminal for outputting a fourth intermediate signal;
a third logic gate, in the second power domain, having a first input terminal connected to the output terminal of the fourth multiplexer for receiving the fourth intermediate signal, a second input terminal for receiving a sixth intermediate signal, and an output terminal for generating a second intermediate output signal; and
a fourth logic gate, in the second power domain, having first and second input terminals connected to the output terminals of the third multiplexer and the third logic gate for receiving the third intermediate signal and the second intermediate output signal, respectively, and an output terminal for generating and providing a second output signal to the second functional unit.

11. The integrated circuit of claim 10, wherein the first set of I/O pads outputs the sixth signal.

12. The integrated circuit of claim 10, wherein the first I/O multiplexing unit further comprises a fifth multiplexer located in a third power domain of the integrated circuit, wherein the fifth multiplexer has first, second, and third input terminals for receiving thirteenth, fourteenth, and fifteenth signals, respectively, a two-bit select terminal for receiving the first and second select signals, and an output terminal for outputting the fifth intermediate signal.

13. The integrated circuit of claim 12, wherein the second I/O multiplexing unit further comprises a sixth multiplexer located in the third power domain, the sixth multiplexer having first, second, and third input terminals for receiving sixteenth, seventeenth, and eighteenth signals, respectively, a two-bit select terminal for receiving the third and fourth select signals, and an output terminal for outputting the sixth intermediate signal.

14. The integrated circuit of claim 13, wherein the fifth through eighteenth signals are at a logic low state.

15. The integrated circuit of claim 10, wherein the first through fourth logic gates are OR gates.

16. The integrated circuit of claim 10, wherein the first power domain is operational when the second power domain is operational.

17. The integrated circuit of claim 10, wherein an I/O pad of the first set of I/O pads generates the first and second signals, and an I/O pad of the second set of I/O pads generates the third and fourth signals.

18. The integrated circuit of claim 10, wherein first and second I/O pads of the first set of I/O pads generate the first and second signals, respectively, and third and fourth I/O pads of the second set of I/O pads generate the third and fourth signals, respectively.

* * * * *